(12) United States Patent
Dai et al.

(10) Patent No.: US 8,890,945 B2
(45) Date of Patent: Nov. 18, 2014

(54) SHARED TERMINAL OF AN IMAGE SENSOR SYSTEM FOR TRANSFERRING IMAGE DATA AND CONTROL SIGNALS

(75) Inventors: Tiejun Dai, Santa Clara, CA (US); Junzhao Lei, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 295 days.

(21) Appl. No.: 13/440,833

(22) Filed: Apr. 5, 2012

(65) Prior Publication Data
US 2013/0264465 A1 Oct. 10, 2013

Related U.S. Application Data

(60) Provisional application No. 61/559,641, filed on Nov. 14, 2011, provisional application No. 61/598,840, filed on Feb. 14, 2012.

(51) Int. Cl.
*A62B 1/04* (2006.01)
*H04N 5/232* (2006.01)

(52) U.S. Cl.
USPC ........................................ 348/65; 348/211.14

(58) Field of Classification Search
CPC .......... A61B 1/05; A61B 1/045; A61B 1/042; H04N 5/232; H04N 5/23203; H04N 5/23206; H04N 7/18; H04N 7/183; H04N 2005/2255
USPC ............ 348/65, 72, 73, 207.1, 211.99–211.3, 348/211.14
See application file for complete search history.

(56) References Cited

U.S. PATENT DOCUMENTS

| | | |
|---|---|---|
| 2002/0106037 A1 | 8/2002 | Gara |
| 2005/0094676 A1 | 5/2005 | Iwami et al. |
| 2006/0066725 A1 | 3/2006 | Dodrill et al. |
| 2007/0070195 A1 | 3/2007 | Abe |
| 2007/0159526 A1 | 7/2007 | Abe |
| 2008/0297213 A1 | 12/2008 | Abbasfar et al. |
| 2009/0216080 A1 | 8/2009 | Nakamura |
| 2010/0013941 A1 | 1/2010 | Berkey et al. |
| 2010/0177230 A1 | 7/2010 | Himeno et al. |
| 2012/0050550 A1 | 3/2012 | Oba et al. |
| 2013/0264465 A1 | 10/2013 | Dai et al. |
| 2013/0264466 A1* | 10/2013 | Dai et al. .................... 250/208.1 |

OTHER PUBLICATIONS

U.S. Appl. No. 13/440,846, Non-final Office Action, mailed Dec. 19, 2013 (10 pages).
U.S. Appl. No. 13/440,846, filed Apr. 5, 2012, Dai et al.

* cited by examiner

*Primary Examiner* — Timothy J Henn
(74) *Attorney, Agent, or Firm* — Blakely Sokoloff Taylor & Zafman LLP

(57) ABSTRACT

An example image sensor system includes an image sensor having a first terminal and a host controller coupled to the first terminal. Logic is included in the image sensor system, that when executed transfers analog image data from the image sensor to the host controller through the first terminal of the image sensor and also transfers one or more digital control signals between the image sensor and the host controller through the same first terminal.

21 Claims, 13 Drawing Sheets

US 8,890,945 B2

SHARED TERMINAL OF AN IMAGE SENSOR SYSTEM FOR TRANSFERRING IMAGE DATA AND CONTROL SIGNALS

This application claims the benefit of U.S. Provisional Application No. 61/559,641, filed Nov. 14, 2011. This application also claims the benefit of U.S. Provisional Application No. 61/598,840, filed Feb. 14, 2012.

TECHNICAL FIELD

This disclosure relates generally to imaging systems, and in particular but not exclusively, relates to imaging systems having a sensor and a controller.

BACKGROUND INFORMATION

Image sensors are widely used in digital cameras, cellular phones, security cameras, as well as, medical, automobile, and other applications. One type of image sensor is known as a complementary metal-oxide-semiconductor (CMOS) image sensor. Multiple CMOS image sensors are typically formed on a semiconductor wafer that is then separated into several dies, each die including at least one image sensor. The semiconductor die is then assembled into a semiconductor package. The semiconductor package provides protection and includes pins, leads, or other chip-scale interfaces, which are then used to connect with circuits that are external to the package. The semiconductor die may be formed having a plurality of bonding pads on the surface of the die for internally connecting (e.g., wire bonding) the image sensor to the pins of the semiconductor package.

The technology used to manufacture image sensors, and in particular, CMOS image sensors, has continued to advance at great pace. For example, the demands of higher resolution and lower power consumption have encouraged the further miniaturization and integration of these image sensors. One field of application in which size and image quality is particularly important is medical applications (e.g., endoscopes). For medical applications the semiconductor package must typically be very small. For example, the need for the endoscopes to be smaller so as to access various small spaces inside the body may be limited by the size of the image sensors mounted on the endoscopes. This is due to the size and pitch requirements of the bonding pads which limit the overall size of the image sensors. The relative percentage of the die area taken up by bonding pads increases as the size of the typical image sensor decreases. Therefore, as the image sensors decrease in size, it becomes ever more difficult to accommodate the number of bonding pads typically included on the semiconductor die.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
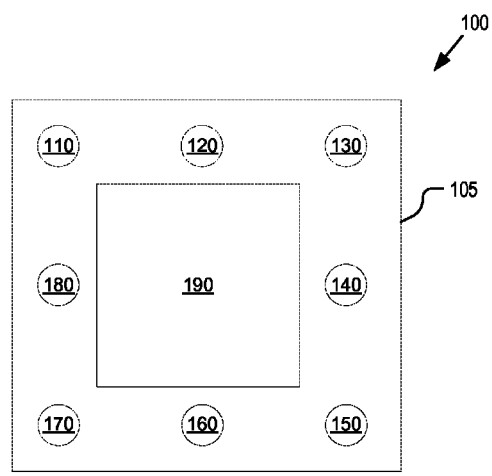
FIG. 1 is a planar view of an image sensor having eight bonding pads.

FIG. 1 is a planar view of an image sensor 100 having eight bonding pads (i.e., 110, 120, 130, 140, 150, 160, 170, and 180). Image sensor 100 includes an active circuit region 190 near the center of semiconductor die 105 and a multitude of bonding pads around the periphery. The eight bonding pads included in image sensor 100 are for bonding semiconductor die 105 to pins of a semiconductor package (not shown) and to provide an electrical connection to an off-chip circuit for transferring various signals. Specifically, pad 110 serves as a ground pad for an analog circuit included in the active circuit region 190; pad 120 serves as a power pad for the analog circuit; pad 130 serves as a power pad for an input-output (I/O) circuit; pad 140 serves as a serial camera control bus (SCCB) input clock pad; pad 150 serves as a reference pad; pad 160 serves as an analog output pad; pad 170 serves as an SCCB data I/O pad; and pad 180 serves as a system input clock pad. Thus, each pad included in image sensor 100 provides a single function. For example, pad 160 is for outputting only an analog signal (e.g., analog image data), pad 170 is only for sending and receiving digital control signals, and pad 180 is for receiving a system clock signal only.

However, as mentioned above, the size and pitch of the bonding pads generally cannot decrease at the same rate as the image sensors. In other words, the number of bonding pads provides a limit on how small semiconductor die 105 can be. As the requirement for smaller image sensors increases, it becomes ever more difficult to accommodate the number of bonding pads typically included on a semiconductor die.

Accordingly, embodiments of the present disclosure provide an image sensor system that includes an image sensor having a reduced number of terminals (e.g., bonding pads, contact pads, bonding wires, pins, leads, etc.). In some embodiments, the number of terminals is reduced by utilizing a single terminal for multiple functions. For example, a shared terminal of an image sensor may be utilized for transferring both analog image data and digital control signals, in accordance with the teachings of the present disclosure.

Figure 2A:
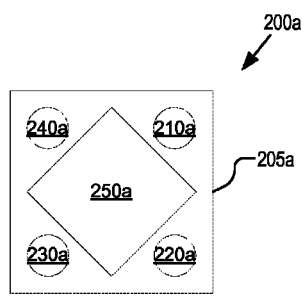
FIG. 2a is a planar view of an image sensor (front side illuminated) having a reduced number of bonding pads, in accordance with an embodiment of the disclosure.

By way of example, FIG. 2a illustrates a planar view of a front side illuminated (FSI) image sensor 200a having a reduced number of bonding pads, in accordance with an embodiment of the disclosure. The illustrated example of FSI image sensor 200a includes an active circuit region 250a and four bonding pads (i.e., 210a, 220a, 230a, and 240a) formed on semiconductor die 205a.

In one embodiment, bonding pad 210a is a power input terminal for image sensor 200a, which receives power from an external source that is to be supplied to various components within image sensor 200a. Pad 220a may be a data terminal for transmitting analog image data obtained by image sensor 200a to an off-chip circuit (not shown). Pad 230a may be a clock input terminal, which receives clock signals from an off-chip clock signal generator (not shown) for use by various components within image sensor 200a. Pad 240a may be a ground pad for serving as a common reference between image sensor 200a and off-chip circuits. In this illustrated embodiment, there are no pads that are exclusively dedicated to the transferring of control signals, such as receiving instructions from an external host controller, sending commands to the host controller, or transferring header information, etc. Instead, data terminal 220a and clock input terminal 230a, either individually or in combination, may be utilized for transferring control signals in addition to their stated functions above (i.e., transferring analog image data and clock signals, respectively).

In one embodiment, pads 210a, 220a, 230a, and 240a are metalized areas on a surface of semiconductor die 205a, to which electrical connections can be made. As used herein, a "terminal" may include a bonding pad, such as pad 210a, 220a, 230a, or 240a. A terminal may also include a bonding wire or lead layer for electrically coupling the bonding pads to chip-scale interfaces, and may include the chip-scale interfaces themselves, such as leads, pins, or ball grid arrays (BGA). Thus, a terminal may refer to any conductive path between image sensor 200a and a circuit external to image sensor die 205a. In one embodiment two bonding pads that are shorted together may still be referred to as a single terminal.

In one embodiment, the illustrated example of image sensor 200a includes no more and no less than the four terminals illustrated (i.e., pad 210a, pad 220a, pad 230a, and pad 240a). However, other embodiments may include more or less terminals as needed for the transferring of additional signals and still benefit from the teachings of the present disclosure.

Figure 2B:
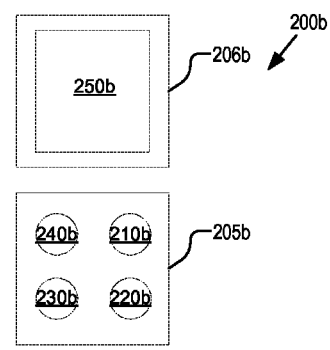
FIG. 2b is a planar view of an image sensor (back side illuminated) having a reduced number of bonding pads, in accordance with an embodiment of the disclosure.

In another example showing an alternative embodiment, FIG. 2b illustrates a planar view of a back side illuminated (BSI) image sensor 200b having a reduced number of bonding pads, in accordance with an embodiment of the disclosure. The illustrated example of BSI image sensor 200b includes an active circuit region 250b on the image sensor die's front side 206b, and four bonding pads (i.e., 210b, 220b, 230b, and 240b) formed on semiconductor die's back side 205b. Similar to the bonding pads shown in FIG. 2a, bonding pad 210b is a power input terminal for image sensor 200b, which receives power from an external source that is to be supplied to various components within image sensor 200b. Pad 220b may be a data terminal for transmitting analog image data obtained by image sensor 200b to an off-chip circuit (not shown). Pad 230b may be a clock input terminal, which receives clock signals from an off-chip clock signal generator (not shown) for use by various components within image sensor 200b. Pad 240b may be a ground pad for serving as a common reference between image sensor 200b and off-chip circuits. Similar to the embodiment shown in FIG. 2a, there are no pads that are exclusively dedicated to the transferring of control signals, such as receiving instructions from an external host controller, sending commands to the host controller, or transferring header information, etc. Instead, data terminal 220b and clock input terminal 230b, either individually or in combination (the term "terminal" used herein is similarly defined as in paragraph 0024), may be utilized for transferring control signals in addition to their stated functions above (i.e., transferring analog image data and clock signals, respectively).

Figure 3:
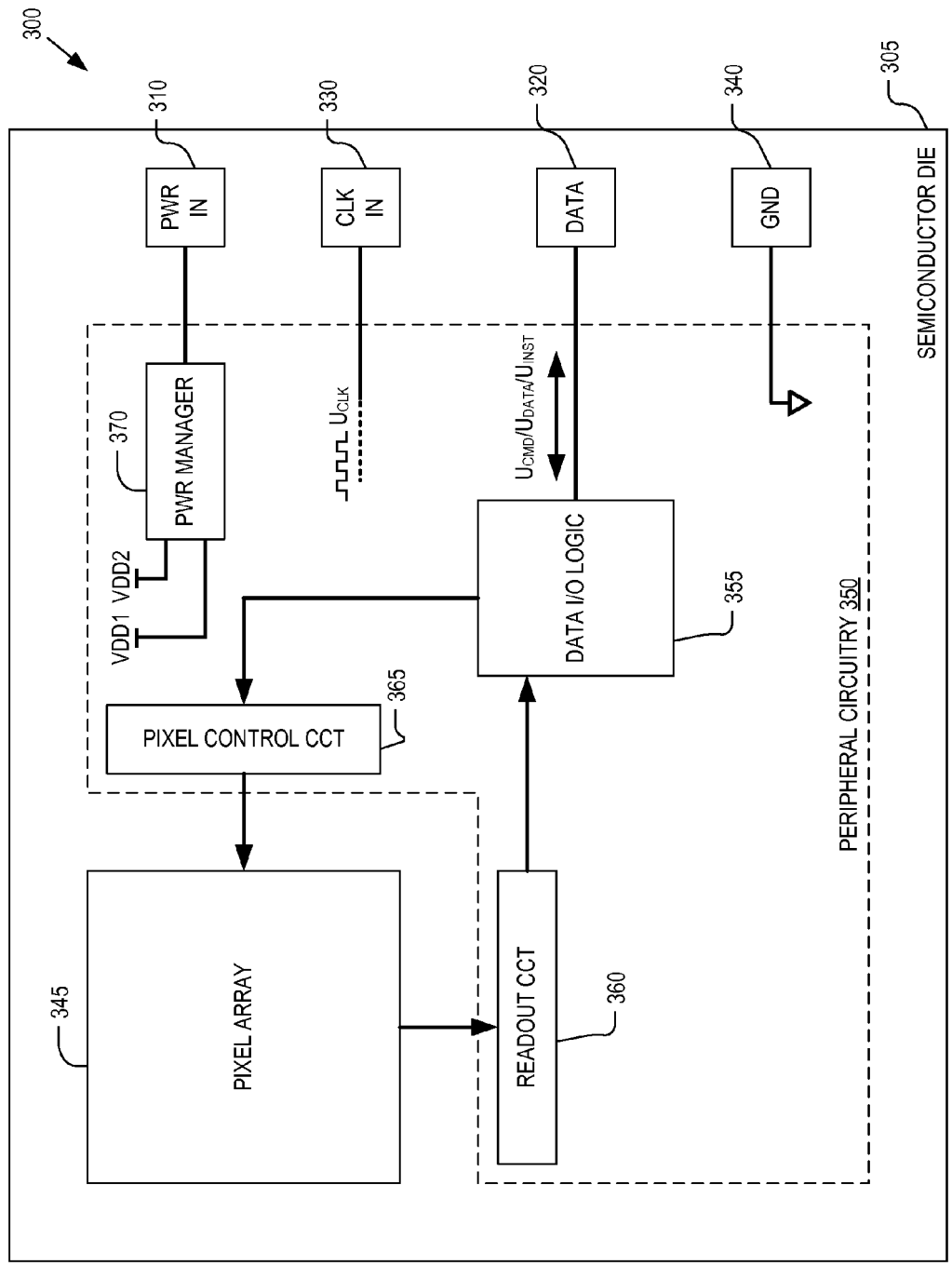
FIG. 3 is a functional block diagram of an image sensor, in accordance with an embodiment of the disclosure.

FIG. 3 is a functional block diagram of an image sensor 300, in accordance with an embodiment of the disclosure. The illustrated embodiment of image sensor 300 includes a semiconductor die 305, four terminals (i.e., a power input pad 310, a data pad 320, a clock input pad 330, and a ground pad 340), a pixel array 345, and peripheral circuitry 350. Peripheral circuitry 350 is shown as including data I/O logic 355, readout circuitry 360, pixel control circuitry 365, and a power manager 370. Image sensor 300 is one possible implementation of image sensor 200a of FIG. 2a and image sensor 200b of FIG. 2b.

Pixel array 345 and peripheral circuitry 350 may be included in an active circuit region, such as active circuit regions 250a in FIG. 2a and circuit region 250b in FIG. 2b, of the semiconductor die. Pixel array 345 is a two-dimensional (2D) array of imaging pixels having a number of pixel columns and a number of pixel rows. In one embodiment, each pixel is a complementary metal-oxide-semiconductor (CMOS) imaging pixel. Pixel array 345 may be implemented as either a front side illuminated pixel array or a backside illuminated image pixel array. Each pixel is arranged into a row and a column to acquire image data of a person, place, or object, which can then be used to render a 2D image of the person, place, or object.

After each pixel has acquired its image data or image charge, the image data is readout by readout circuitry 360. In one embodiment, the image data is readout as an analog voltage level on each readout column. The image data is then sequentially provided to data I/O logic 355 which outputs an analog image data signal $U_{DATA}$ on data pad 320 for delivery to an external circuit, such as a host controller.

Although the illustrated embodiment of image sensor 300 outputs analog image data, other embodiments may include analog-to-digital converters (ADC) integrated into image sensor 300 for outputting digital image data. However, in many medical device applications, it is often desirable to minimize the overall chip size of image sensor 300 while maximizing the on-die real estate devoted to pixel array 345 to achieve the greatest possible image quality. As such, in the illustrated embodiment ADC circuitry has been pushed off-chip to reduce on-die real estate consumed by peripheral circuitry 350.

Pixel control circuitry 365 is configured to control the operation of pixel array 345. For example, pixel control circuitry 365 may include logic for determining which rows/columns of pixel array 345 are selected. Other functionality included within pixel control circuitry 365 may include generation of reset signals and shutter signals for controlling image acquisition. In one embodiment, the shutter signal is a global shutter signal received from data I/O logic 355 for simultaneously enabling all pixels within pixel array 345 to simultaneously capture their respective image data during a single acquisition window (exposure period). In an alternative embodiment, the shutter signal is a rolling shutter signal whereby each row, column, or group of pixels is sequentially enabled during consecutive acquisition windows.

Power manager 370 is included in peripheral circuitry 350 and is coupled to power input pad 310 to receive power from a source external to image sensor 300. Power manager 370 may be configured to provide power to various circuits included in image sensor 300. For example, power manager 370 may provide a first source of power for analog circuitry and a second source of power for digital circuitry, shown in FIG. 3 as VDD1 and VDD2, respectively.

Clock input pad 330 is coupled to receive a clock signal $U_{CLK}$ from an external clock generator (not shown). The clock signal $U_{CLK}$ may be provided to various circuits within image sensor 300, such as control circuit 365, readout circuit 360, and data I/O logic 355 for synchronizing image sensor 300 with an external circuit, such as a host controller.

Power input pad 310, data pad 320, clock input pad 330, and ground pad 340 may be bonding pads, each including a metalized area on the surface of semiconductor die 305 for providing an electrical path between peripheral circuitry 350 and off-chip circuits, such as a host controller. In the illustrated embodiment of image sensor 300, data pad 320 provides functions in addition to transferring analog image data signal $U_{DATA}$ from image sensor 300 to an external circuit (e.g., host controller). In particular, data pad 320 is also used for transferring one or more digital control signals between the image sensor 300 and the external circuit. Examples of such digital control signals includes instruction signals $U_{INST}$ received from a host, command signals $U_{CMD}$ sent to the host, and header information, etc. Header information may include Red-Blue-Green (RBG) color, optical black, normal, and/or other pixel information. Examples of instructions received and commands sent include read register, write register, reset register, etc. Other information included in the control signals may be red color, green color, blue color, row information, frame information, gain information, global shutter timing, and reset timing. As mentioned above, the control signals may be in digital form and may be both sent to and received from a host controller. Thus, data pad 320 is a bidirectional terminal that receives digital control signals, transmits digital control signals, and transmits analog image data signals.

Data I/O logic 355 is coupled to data pad 320 and includes logic that when executed performs the operations of transferring analog image data (i.e., $U_{DATA}$) and control signals (e.g., $U_{INST}$ and $U_{CMD}$) both through the same terminal data pad 320. Data I/O logic 355 may represent executable code (e.g., software or firmware), hardware logic, or a combination of both.

By using data pad 320 in conjunction with data I/O logic 355 to send and/or receive control signals in addition to image data, the number of pads included on semiconductor die 305 may be reduced, because conventional pads exclusively dedicated to sending and receiving control signals may be eliminated.

Figure 4:
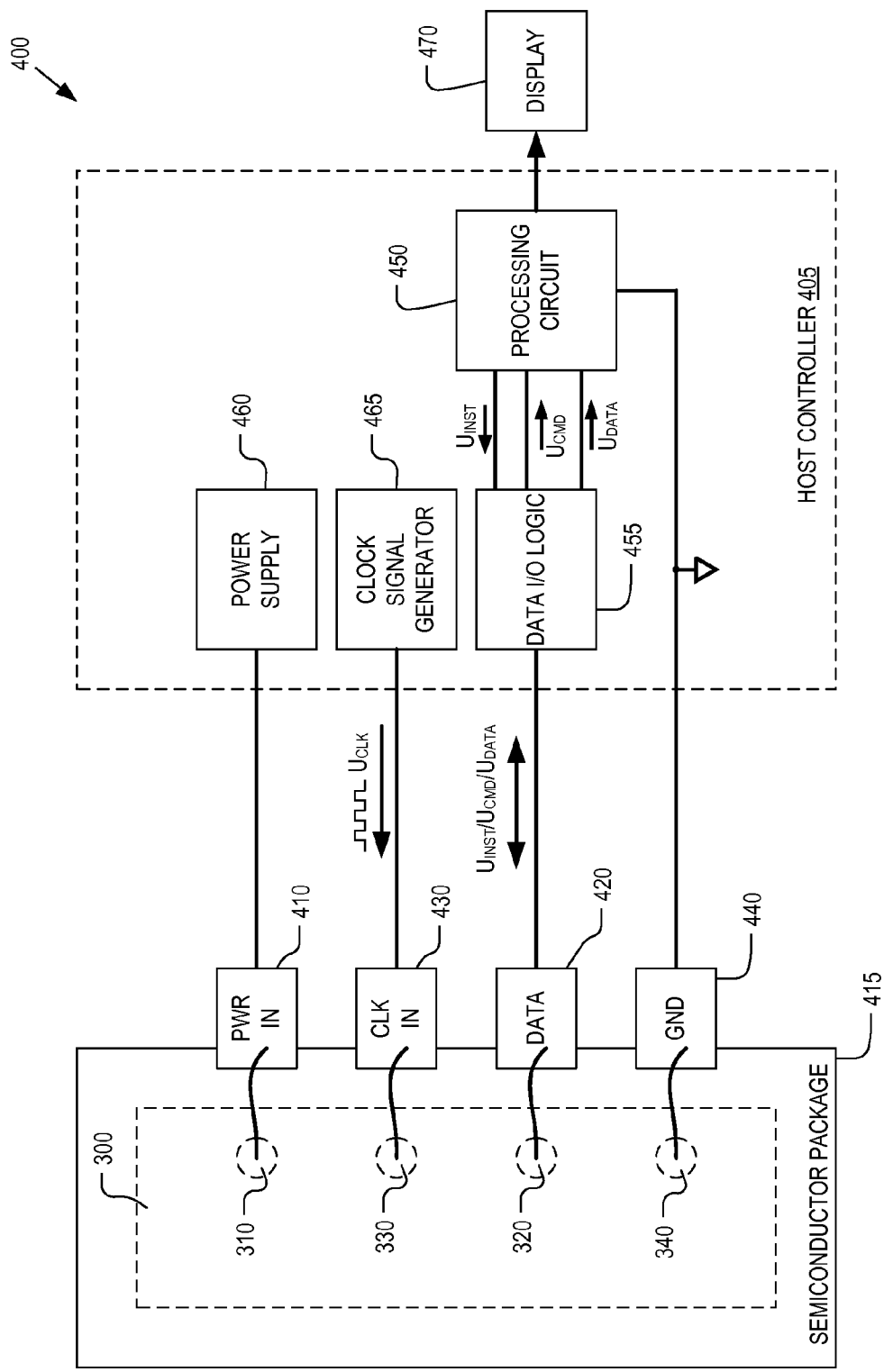
FIG. 4 is a functional block diagram of an image sensor system incorporating the image sensor of FIG. 3, in accordance with an embodiment of the disclosure.

FIG. 4 is a functional block diagram of an image sensor system 400 incorporating the image sensor 300 of FIG. 3, in accordance with an embodiment of the disclosure. Image sensor system 400 includes a host controller 405, and image sensor 300 incorporated into a semiconductor package 415. Semiconductor package 410 is shown as including a power input terminal 410, a data terminal 420, a clock input terminal 430, and a ground terminal 440. Host controller 405 includes a processing circuit 450, data I/O logic 455, optional power supply 460, and optional clock signal generator 465.

As shown in FIG. 4, image sensor 300 is included in semiconductor package 415, where each bonding pad (i.e., pad 310, 320, 330, and 340) are electrically connected with their respective chip-scale terminal (i.e., terminal 410, 420, 430, and 440). Terminals 410, 420, 430, and 440 may be leads, pins, bump pads, ball grid arrays (BGA), or any other conductor for converting the bonding pads into a chip-scale interface.

Host controller 405 is shown as including an optional power supply 460 for providing power to the power input terminal 410 to power the circuits of image sensor 300. However, in one embodiment host controller 405 does not include power supply 460, and power is provided by a source external to both image sensor 300 and host controller 405. Also shown as included in host controller 405 is clock signal generator 465. Clock signal generator 465 generates the clock signal $U_{CLK}$ and transfers it to the clock input terminal 410. However, in one embodiment, clock signal $U_{CLK}$ is generated by a source external to both image sensor 300 and host controller 405.

Host controller 405 is also shown as including a processing circuit 450. Processing circuit 450 may be implemented in hardware, software, firmware, or a combination of the two. In one embodiment, processing circuit 450 includes an analog-to-digital converter (ADC) for converting the analog image data signal $U_{DATA}$ into digital data. Processing circuit 450 may also include storage for storing the image data, or in another aspect, the processing circuit may manipulate the image data using various ways known in the arts (e.g., crop, rotate, remove red eye, adjust brightness, adjust contrast, etc). As shown in FIG. 4, processing circuit 450 is coupled to output the acquired image to a display 470. Display 470 may be a monitor, a television, a printer, or other means of displaying an image.

Processing circuit 450 is also configured to control operational characteristics of the pixel array included in image sensor 300. For example, processing circuit 405 may generate a control signal that indicates shutter timing for controlling image acquisition. The shutter control signal may be a global shutter signal or a rolling shutter signal. Host controller 405 is also shown as sending instruction signals $U_{INST}$ and receiving command signals $U_{CMD}$ through data terminal 420 via data I/O logic 455.

Data I/O logic 455 functions similar to the data I/O logic 355 included in image sensor 300. As shown data I/O logic 455 coupled to data terminal 420 via a wire or other means and includes logic that when executed performs the operations of transferring analog image data (i.e., $U_{DATA}$) and control signals (e.g., $U_{INST}$ and $U_{CMD}$) both through the same data terminal 420. Data I/O logic 455 may represent executable code (e.g., software or firmware), hardware logic, or a combination of both.

Figure 5:
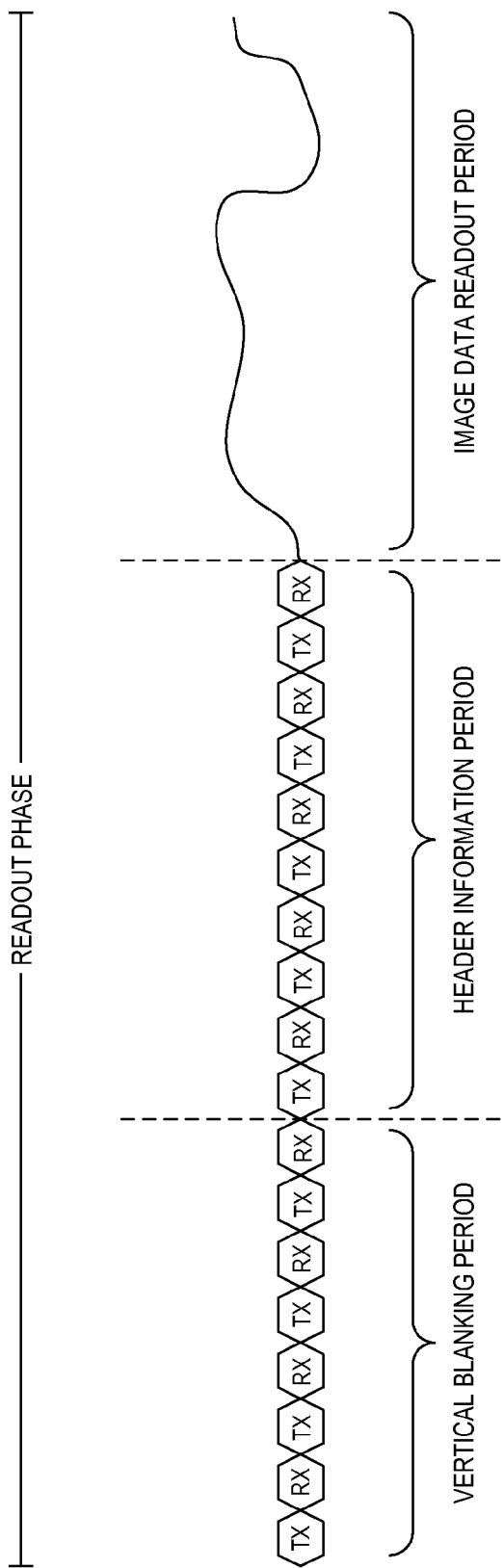
FIG. 5 is a timing diagram of a readout phase for transferring image data, in accordance with an embodiment of the disclosure.

FIG. 5 illustrates a timing diagram of a readout phase for transferring image data and control signals via a single terminal (e.g., data terminal 320), in accordance with an embodiment of the disclosure. As mentioned above, portions of the pixel array may be readout by the image sensor sequentially. That is, the image data may be read out row by row or column by column. In one embodiment, each column or row is read out in a readout phase, as shown in FIG. 5. Thus, image data read out in one readout phase may include image data for a single column or row, where a series of readout phases includes image data of a complete image acquired by the image sensor. Between a complete series of readout phases, representing a complete image, is a reset phase (not shown). The reset phase is a time period given for the image sensor to reset for the next round of data gathering and output.

As shown in FIG. 5, a readout phase may be divided into three periods—a vertical blanking period, a header information period, and an image data readout period. The vertical blanking period typically represents the time between sequential readouts by the image sensor and may be used by the image sensor to acquire and/or readout the next portion of the pixel array. The header information period may be used by the image sensor and/or host controller to transfer information about the next portion of the image sensor about to be read out. For example, header information may include the row location, the column location, Red-Blue-Green (RBG) color values, optical black value, normal, and/or other pixel information. During the image data readout period analog image data is transferred from the image sensor to the host controller.

In one embodiment, the length of one or more of the vertical blanking period, the header information period, and the image data readout period is predetermined. Thus, both the host controller and the image sensor contain logic to automatically transition to the next period after a predetermined time. In another embodiment, a control signal may be transmitted between the image sensor and host controller via the single terminal triggering the transition from one period of the readout phase to the next.

Each of the aforementioned control signals (e.g., $U_{CMD}$, $U_{INST}$) may be transferred between an image sensor and a host controller during the vertical blanking period and/or the header information period of the readout phase. For example, in the embodiment of FIG. 4, image sensor 300 may transfer a command signal $U_{CMD}$ to host controller 405 through data terminal 420 during the vertical blanking period and/or during the header information period. In addition, image sensor 300 may receive an instruction signal $U_{INST}$ from the host controller 405 through data terminal 420 during the vertical blanking period and/or during the header information period. Thus, in the embodiment of FIG. 4, data terminal 420 is a bi-directional terminal used for transferring an analog image data signal $U_{DATA}$ from image sensor 300 to host controller 405, transferring command signals $U_{CMD}$ from image sensor 300 to host controller 405, and receiving instruction signals $U_{INST}$ from host controller 405 to image sensor 300.

Referring now back to FIG. 5, the vertical blanking period and the header information period may alternate between periods of transmitting (TX) and periods of receiving (RX) control signals to accommodate the bi-directionality of the single terminal (e.g., data terminal 420). In one embodiment, the data I/O logic (e.g., data I/O logic 355 and 455) includes a bi-directional switch to control the direction of data flow on the single terminal. In one example, the length and number of transmitting and receiving periods is predetermined. Thus, both the host controller and the image sensor contain logic to automatically transition between transmitting and receiving at predetermined intervals. In another embodiment, a control signal may be transmitted between the image sensor and host controller via the single terminal triggering the transition from transmitting to receiving or vice versa. In yet another embodiment, the host controller and image sensor operate in a master/slave mode of communication where one of the devices has unidirectional control over the other device. For example, host controller 405 of FIG. 4 may operate as a master device dictating the times at which image sensor 300 is receiving control signals via terminal 402 and when image sensor 300 is transmitting control signals via terminal 402.

FIGS. 6A-6E are timing diagrams illustrating one or more examples of a control signal waveform, in accordance with embodiments of the disclosure. The control signals illustrated in FIGS. 6A-6E may represent any of the aforementioned control signals (i.e., $U_{CMD}$ and $U_{INST}$) transferred through a terminal, such as pad 320 in FIG. 3. In particular, the pad voltages $V_{PAD}$ shown in FIGS. 6A-6E may represent the voltage appearing on any of the terminals disclosed, such as pad 320 of image sensor 300 during transmission or receipt of control signals.

Figure 6A:
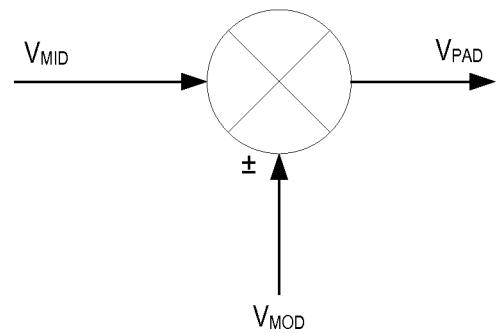
FIGS. 6A-6E are timing diagrams illustrating one or more examples of a control signal waveform, in accordance with embodiments of the disclosure.
Figure 6A:
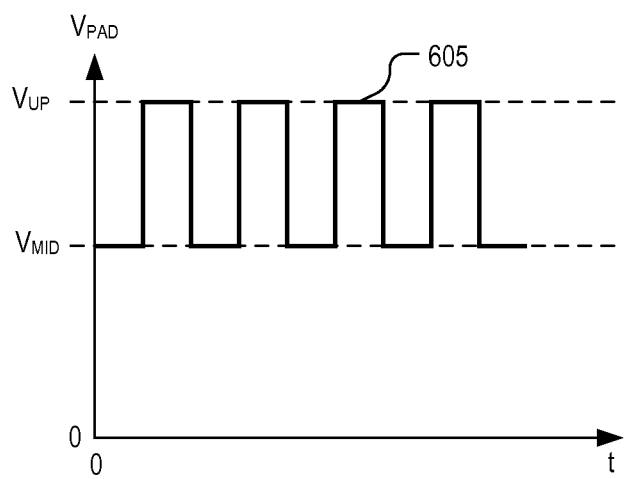

FIG. 6A illustrates a control signal having two voltage levels: a mid-voltage $V_{MID}$ and an upper voltage $V_{UP}$. In this embodiment, the mid-voltage $V_{MID}$ may be considered a base level voltage to which a modulating signal $V_{MOD}$ is added to generate the upper voltage $V_{UP}$. In one embodiment, mid-voltage $V_{MID}$ may have a value of between 0.2 and 0.6 volts and upper voltage $V_{UP}$ may have a value of between 0.6 and 1.8 volts. For example, mid-voltage $V_{MID}$ may be 0.4 volts and upper voltage $V_{UP}$ may be 0.8 volts. Thus, the pad voltage $V_{PAD}$ of FIG. 6A is modulated between mid-voltage $V_{MID}$ and upper voltage $V_{UP}$ to communicate digital controls signal 605 between an image sensor and host controller.

Figure 6B:
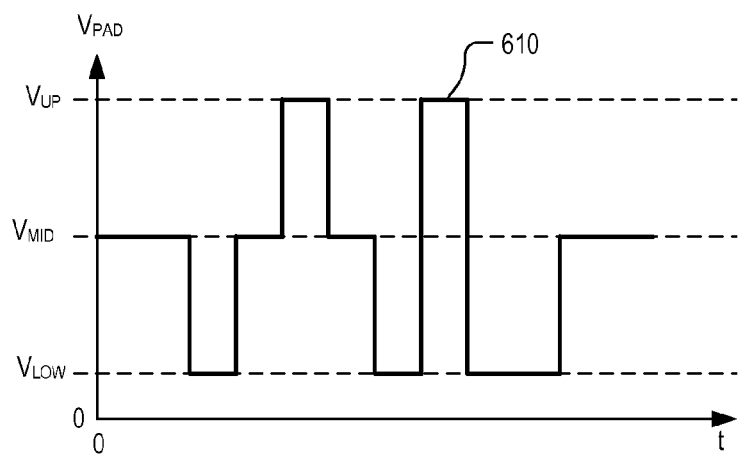

In the embodiment of FIG. 6B, the pad voltage $V_{PAD}$ is modulated between three voltage levels: a lower voltage $V_{LOW}$, mid-voltage $V_{MID}$, and upper voltage $V_{UP}$ to communicate digital control signal 610 through a terminal. In this embodiment the lower voltage $V_{LOW}$ may have a value of between 0.0 and 0.2 volts, for example, 0.2 volts. Thus, in this embodiment digital control signal 610 includes more than two discrete voltage levels (i.e., $V_{LOW}$, $V_{MID}$, and $V_{UP}$).

Figure 6C:
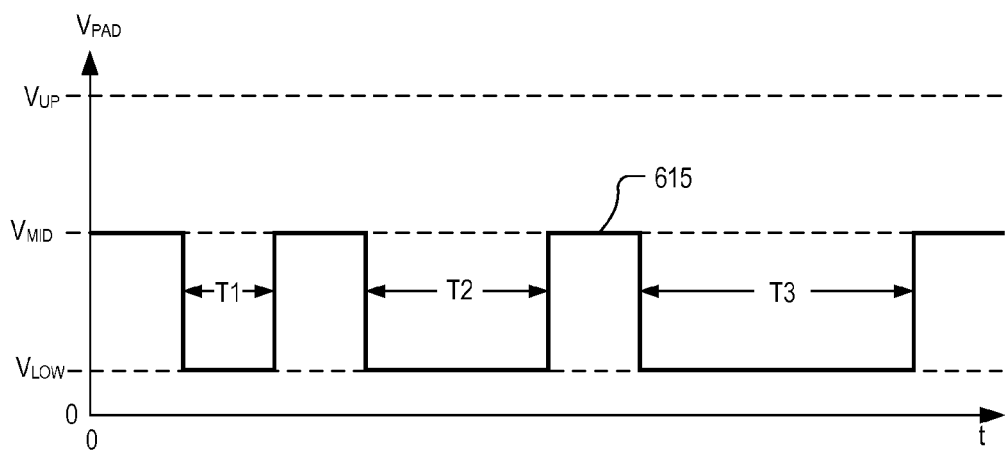
Figure 6D:
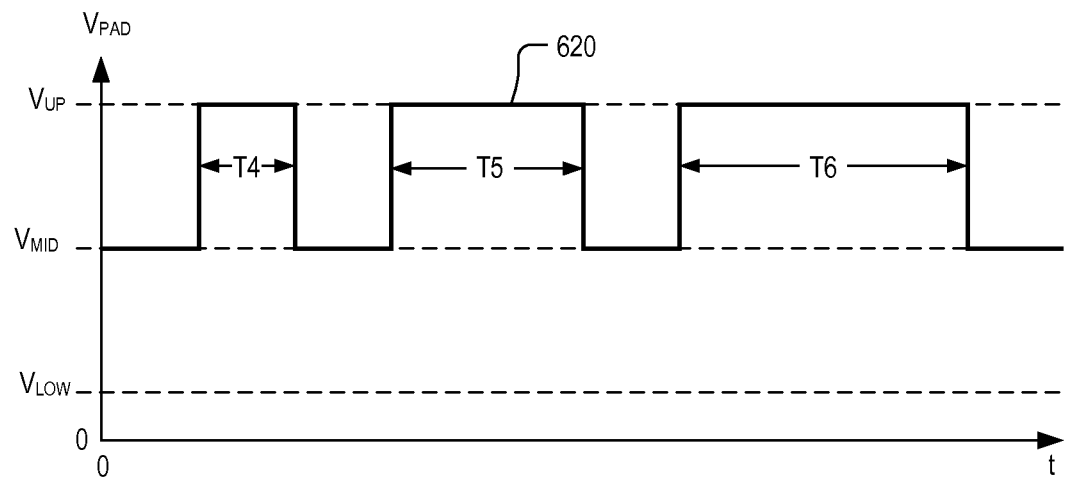
Figure 6E:
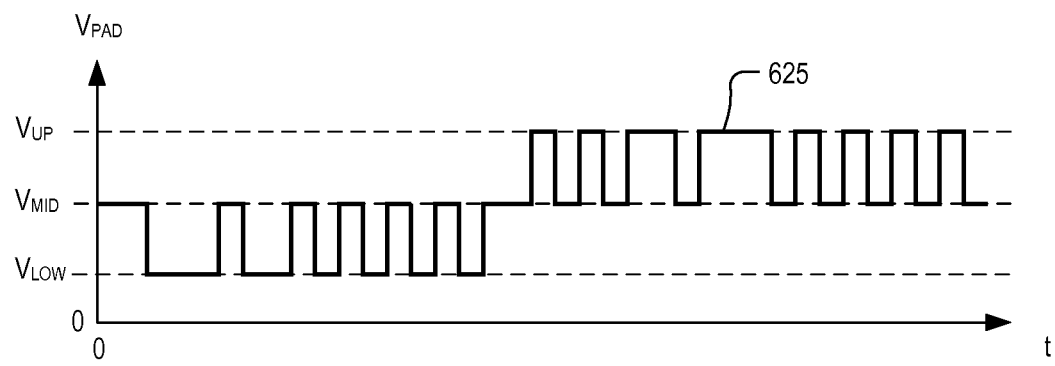

The embodiments of FIGS. 6C and 6D, illustrate varying lengths of digital signals used to communicate digital control signals. In particular, FIG. 6C illustrates a control signal 615 having varying times between pulses. For example, period T1 may represent a short time between pulses, period T2 a medium time between pulses, and period T3 a long time between pulses. In one embodiment, period T1 may be four clock cycles, period T2 may be eight clock cycles, and period T3 may be sixteen clock cycles. Similarly, FIG. 6D illustrates a control signal 620 having pulses of varying pulse width. That is, control signal 620 has a short pulse of period T4, a medium pulse of period T5, and a long pulse of period T6. In each of the embodiments of FIGS. 6C and 6D the varying lengths of digital signals may be used to communicate a variety of instructions and/or commands between the image sensor and host controller. For example, the length of a pulse or time between pulses may indicate red color, green color, blue color, row information, frame information, global shutter function, and reset function, etc. FIG. 6E illustrates an example control signal 625 that utilizes a variety of the methods described in FIGS. 6A-6D. For example, control signal 625 includes short, medium, and long periods between pulses, short, medium, and long pulses, and more than two discrete voltage levels.

Figure 7:
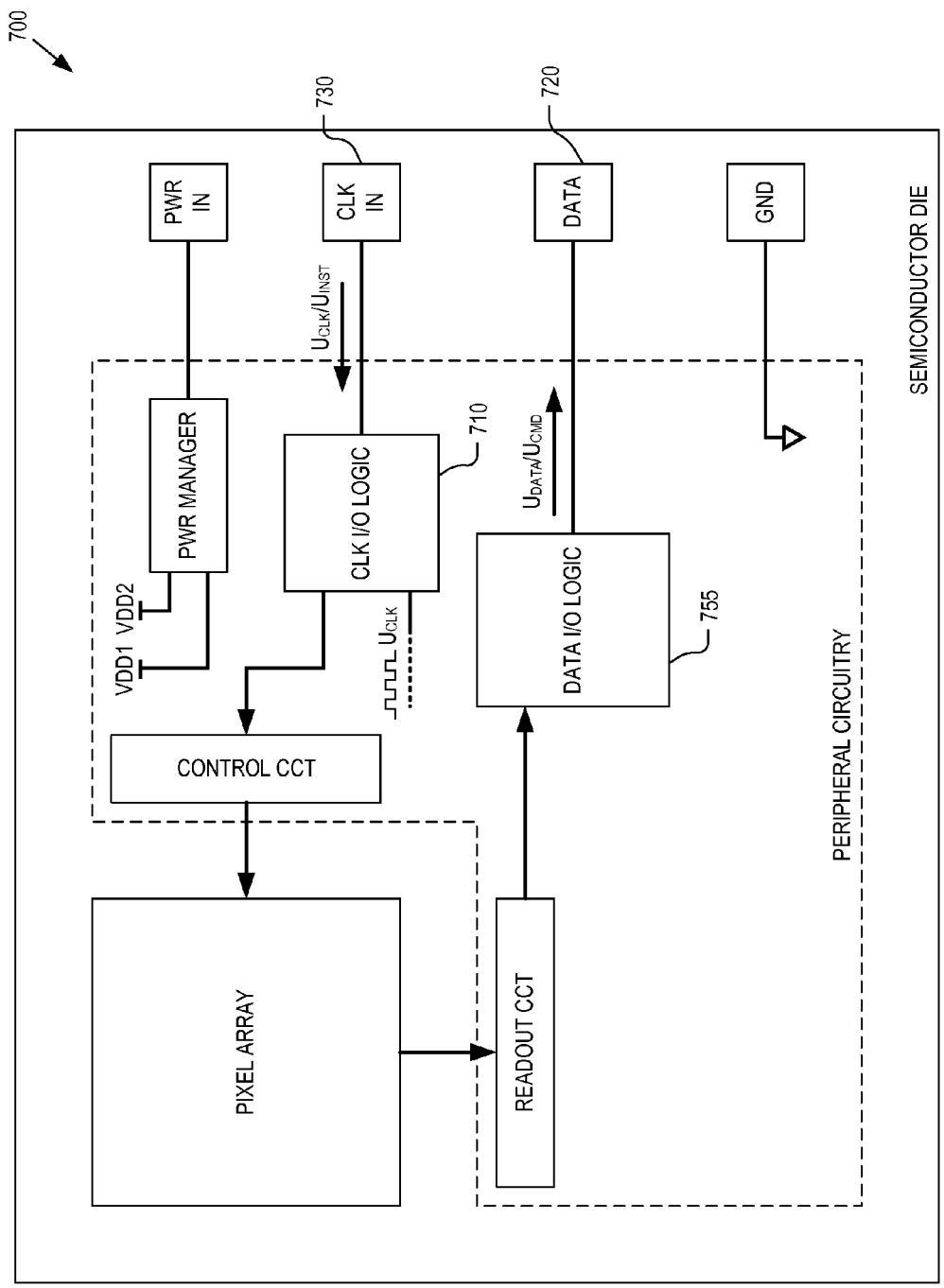
FIG. 7 is a functional block diagram of another image sensor, in accordance with an embodiment of the disclosure.

FIG. 7 is a functional block diagram of another image sensor 700, in accordance with an embodiment of the disclosure. Image sensor 700 is similar to image sensor 300 discussed above with reference to FIG. 3, except that image sensor 700 includes a clock I/O logic 710 for transferring clock signal and instructional signal. Further, data pad 720 is utilized for transferring command signals to the host, while clock input pad 730 is utilized for receiving instructions from the host.

As shown in FIG. 7, image sensor 700 includes a clock I/O logic 710 coupled to clock input pad 730. Clock I/O logic 710 includes logic that when executed performs the operations of transferring clock signal $U_{CLK}$ and instruction signal $U_{INST}$ both through the same terminal (i.e., clock input pad 730). Data I/O logic 755 is coupled to data pad 720 and includes logic that when executed performs the operations of transferring analog image data (i.e., $U_{DATA}$) and command signal $U_{CMD}$ both through another terminal (i.e., data pad 720). Clock I/O logic 710 and Data I/O logic 755 may represent executable code (e.g., software or firmware), hardware logic, or a combination of both. Thus, in this embodiment, both clock input pad 730 and data pad 720 are unidirectional terminals, where clock input pad 730 receives clock signal $U_{CLK}$ and instruction signal $U_{INST}$ from a host, while data pad 720 transmits command signal $U_{CMD}$ and analog image data signal $U_{DATA}$ to the host.

The control signals utilized by image sensor 700 may include any of the control signals described with reference to FIGS. 6A-6E. In addition, clock input pad 730 may be used to receive global shutter timing during the vertical blanking period of the readout phase. Clock pad 730 may also be used to receive reset signals during the reset phase, discussed above. In one embodiment, clock pad 730 is used to receive instructions during the readout phase, for example, during the vertical blanking period, where the amplitude of the instruction signal $U_{INST}$ may be smaller or larger than the amplitude of the clock signal $U_{CLK}$. Thus, clock I/O logic 710 may include circuitry to discern between the instruction signal $U_{INST}$ and clock signal $U_{CLK}$ based on the amplitude of the voltage $V_{PAD}$ on clock input pad 730.

In yet another embodiment, clock pad 730 receives the instruction signals $U_{INST}$ only during the vertical blanking period of the readout phase and receives clock signal $U_{CLK}$ during both the header information and image data readout periods.

Figure 8:
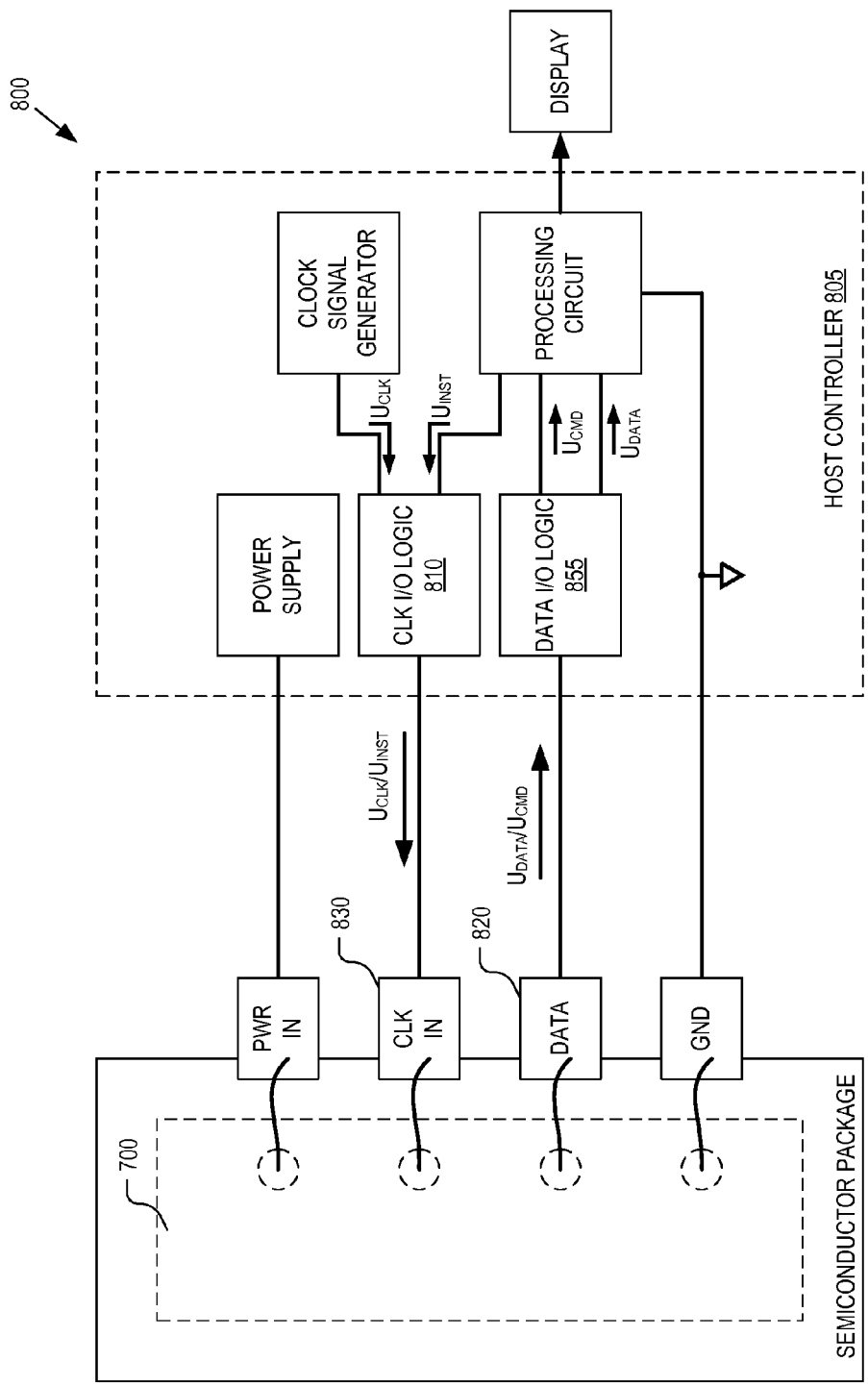
FIG. 8 is a functional block diagram of an image sensor system incorporating the image sensor of FIG. 7, in accordance with an embodiment of the disclosure.

FIG. 8 is a functional block diagram of an image sensor system 800 incorporating the image sensor 700 of FIG. 7, in accordance with an embodiment of the disclosure. Image sensor system 800 is similar to image sensor system 400 discussed above with reference to FIG. 4, except that host controller 805 includes clock I/O logic 810. Further, data terminal 820 is utilized for transferring command signals to host controller 805, while clock input terminal 830 is utilized for receiving instructions from host controller 805.

As shown in FIG. 8, host controller 805 includes a clock I/O logic 810 coupled to clock input terminal 830 of image sensor 700. Clock I/O logic 810 includes logic that when executed performs the operations of transferring clock signal $U_{CLK}$ and instruction signal $U_{INST}$ both through the clock input terminal 830. Data I/O logic 855 is coupled to data terminal 820 and includes logic that when executed performs the operations of transferring analog image data (i.e., $U_{DATA}$) and command signal $U_{CMD}$ both through data terminal 820. Clock I/O logic 810 and Data I/O logic 855 may represent executable code (e.g., software or firmware), hardware logic, or a combination of both.

Figure 9:
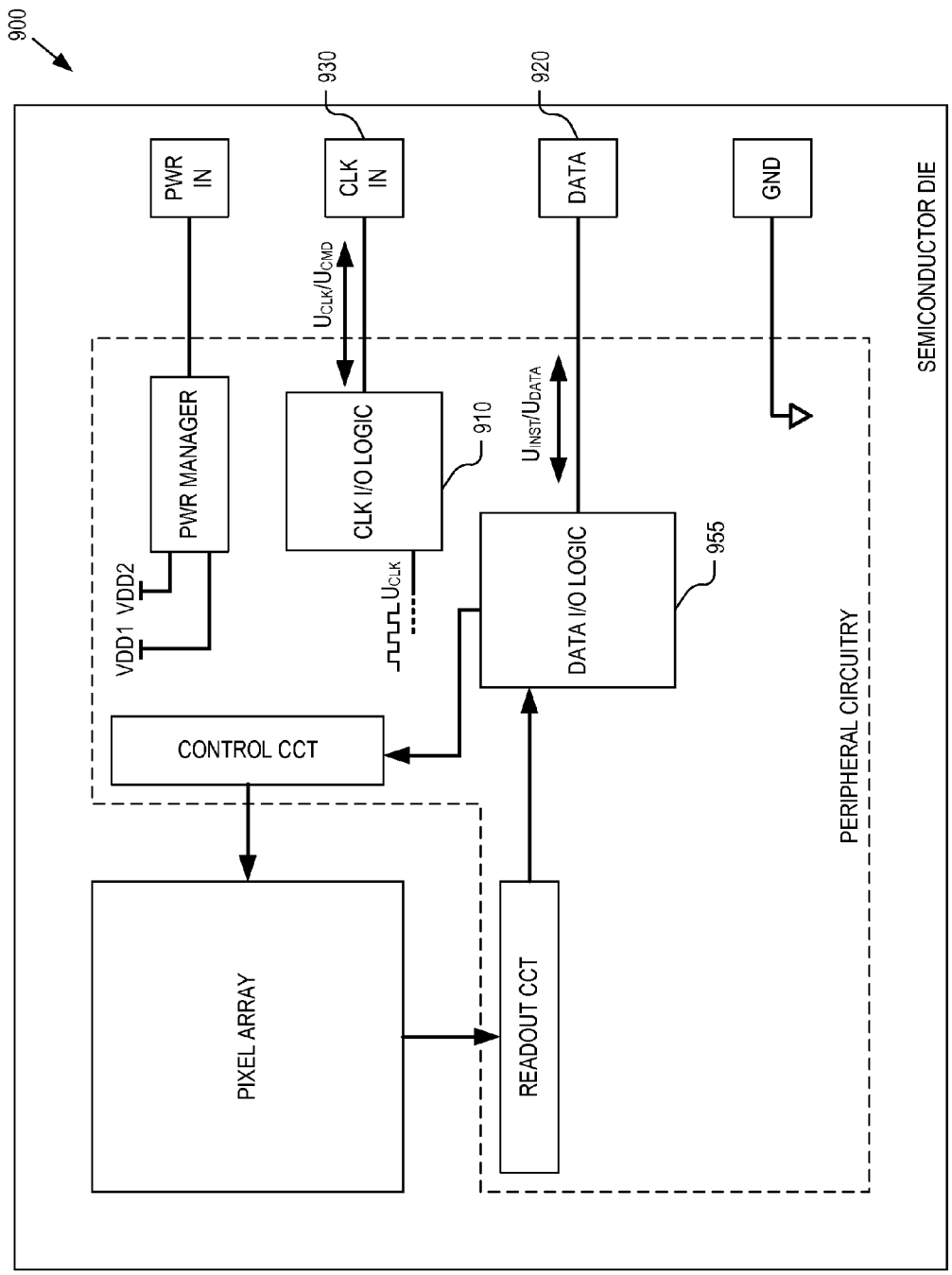
FIG. 9 is a functional block diagram of yet another image sensor, in accordance with an embodiment of the disclosure.

FIG. 9 is a functional block diagram of yet another image sensor, in accordance with an embodiment of the disclosure. Image sensor 900 is similar to image sensor 700 discussed above with reference to FIG. 7, except data pad 920 is utilized for receiving instruction signals $U_{INST}$ from the host, while clock input pad 830 is utilized for transferring command signals $U_{CMD}$ to the host.

As shown in FIG. 9, image sensor 900 includes a clock I/O logic 910 coupled to clock input pad 930. Clock I/O logic 910 includes logic that when executed performs the operations of transferring clock signal $U_{CLK}$ and command signal $U_{CMD}$ both through the same terminal (i.e., clock input pad 930). Data I/O logic 955 is coupled to data pad 920 and includes logic that when executed performs the operations of transferring analog image data (i.e., $U_{DATA}$) and instruction signal $U_{INST}$ both through another terminal (i.e., data pad 920). Clock I/O logic 910 and Data I/O logic 955 may represent executable code (e.g., software or firmware), hardware logic, or a combination of both. Thus, in this embodiment, both clock input pad 930 and data pad 920 are bi-directional terminals, where clock input pad 930 receives clock signal $U_{CLK}$ from a host and transmits command signal $U_{CMD}$ to the host, while data pad 920 receives instruction signal $U_{INST}$ from the host and transmits analog image data signal $U_{DATA}$ to the host.

The control signals utilized by image sensor 900 may include any of the control signals described with reference to FIGS. 6A-6E. In one embodiment, clock pad 930 transmits the command signals $U_{CMD}$ only during the vertical blanking period of the readout phase and receives clock signal $U_{CLK}$ during both the header information and image data readout periods.

Figure 10:
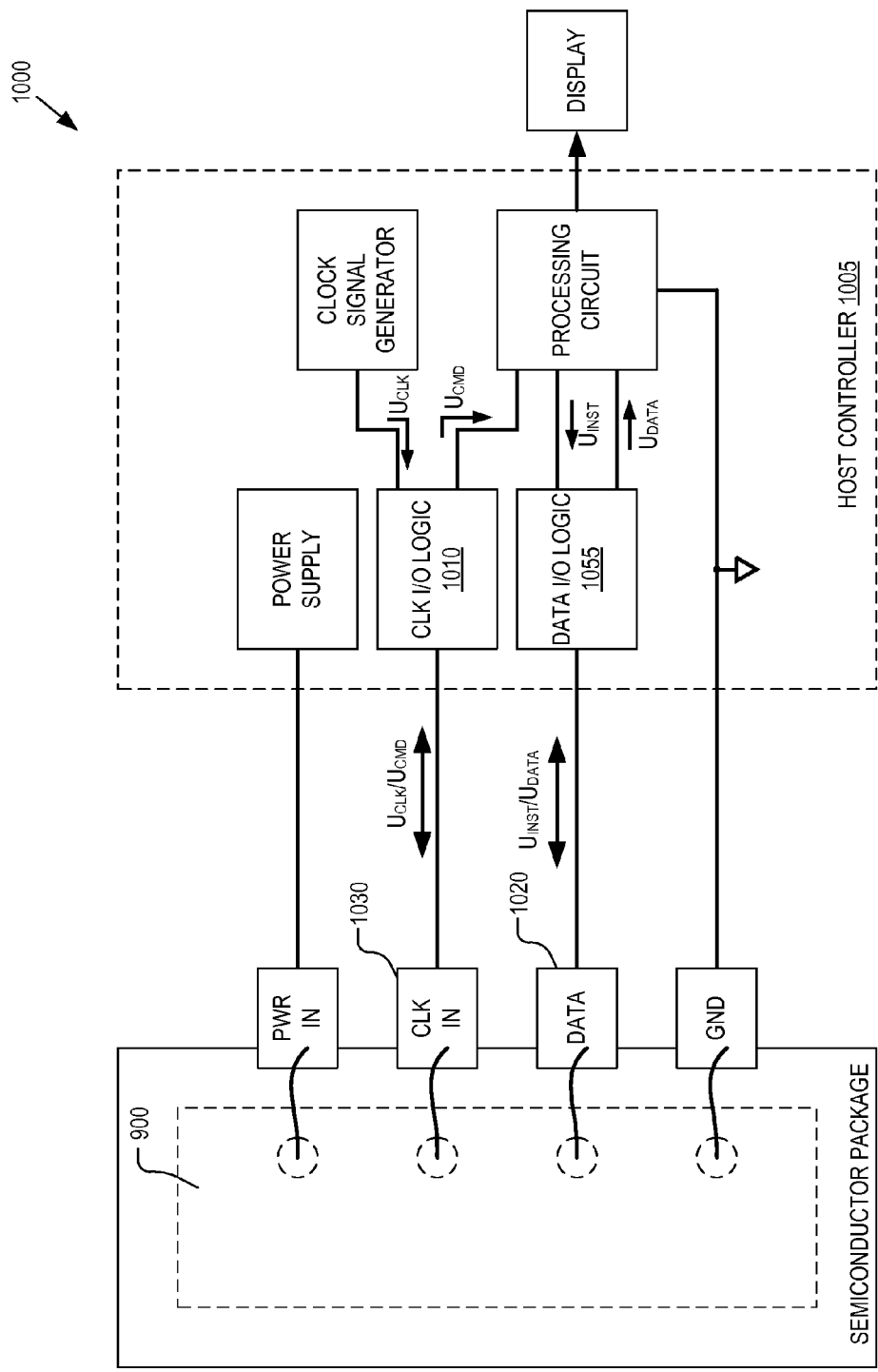
FIG. 10 is a functional block diagram of an image sensor system incorporating the image sensor of FIG. 9, in accordance with an embodiment of the disclosure.

FIG. 10 is a functional block diagram of an image sensor system 1000 incorporating the image sensor 900 of FIG. 9, in accordance with an embodiment of the disclosure. Image sensor system 1000 is similar to image sensor system 800 discussed above with reference to FIG. 8, except data terminal 1020 is utilized for transferring instruction signals $U_{INST}$ from host controller 1005, while clock input terminal 1030 is utilized for transferring command signals $U_{CMD}$ to host controller 1005.

As shown in FIG. 10, host controller 1005 includes a clock I/O logic 1010 coupled to clock input terminal 1030 of image sensor 900. Clock I/O logic 1010 includes logic that when executed performs the operations of transferring clock signal $U_{CLK}$ and command signal $U_{CMD}$ both through the clock input terminal 1030. Data I/O logic 1055 is coupled to data terminal 1020 and includes logic that when executed performs the operations of transferring analog image data (i.e., $U_{DATA}$) and instruction signal $U_{INST}$ both through data terminal 1020. Clock I/O logic 1010 and Data I/O logic 1055 may represent executable code (e.g., software or firmware), hardware logic, or a combination of both.

Figure 11A:
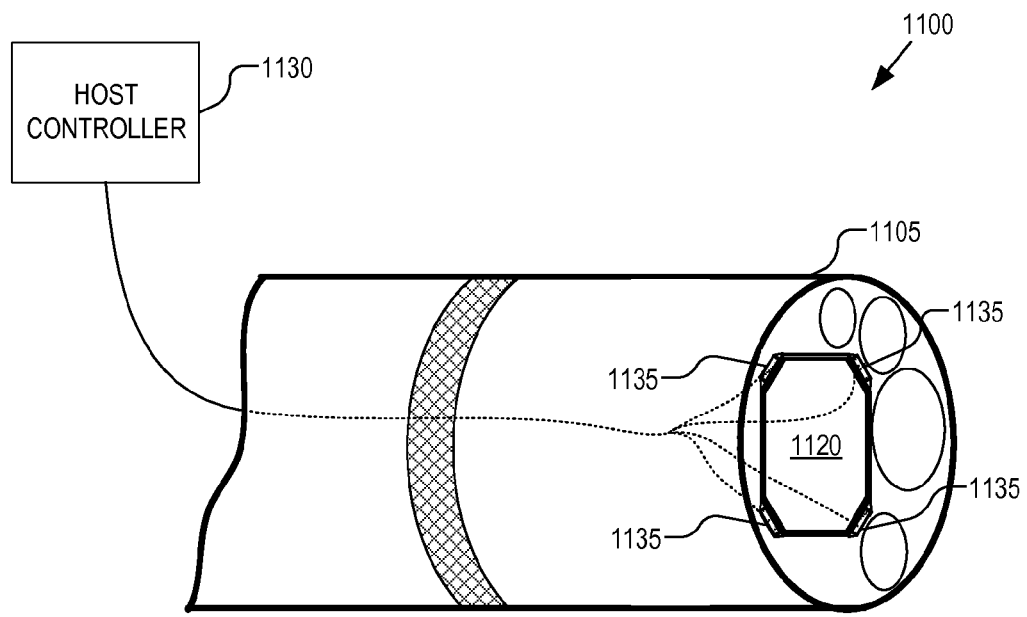
FIGS. 11A-11D are diagrams of various endoscopes including an image sensor, in accordance with an embodiment of the disclosure.
Figure 11B:
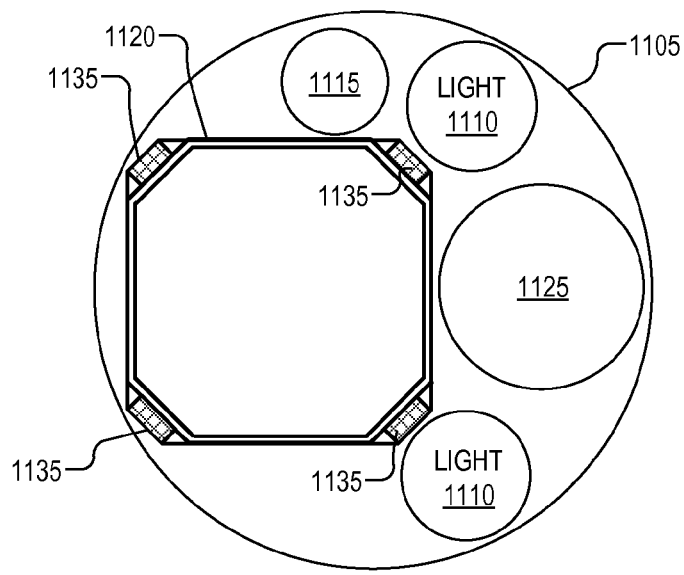

FIGS. 11A and 11B are diagrams of an endoscope 1100 including an image sensor 1120, in accordance with an embodiment of the disclosure. Endoscope tip 1105 is for inserting, often into a cavity to provide imaging data. In FIG. 11A, image sensor 1120 is disposed on endoscope tip 1105. FIG. 11A also illustrates host controller 1130 coupled to image sensor 1120 via four terminals 1135. Image sensor 1120 may be any of the previously discussed image sensors including image sensors 200a, 200b, 300, 700, or 900. Host controller 1130 may be any of the previously discussed host controllers including host controllers 405, 805, or 1005.

FIG. 11B is a front view of endoscope tip 1105 that includes lights 1110, and accessories 1115 and 1125. Endoscope tip 1100 may be used in the medical field or otherwise. Accessories 1115 and 1125 may include suction or forceps utilities. The reduction in the number of terminals included on image sensor 1120 may allow for the overall size of image sensor 1120 to be reduced and in turn, the overall size of endoscope time 1105 may be reduced. In addition, a reduced size image sensor 1120 may allow for improved, larger, or additional accessories to fit within endoscope tip 1105. Any of these improvements may increase the success rate of the action being performed with the endoscope (such as surgery).

Figure 11C:
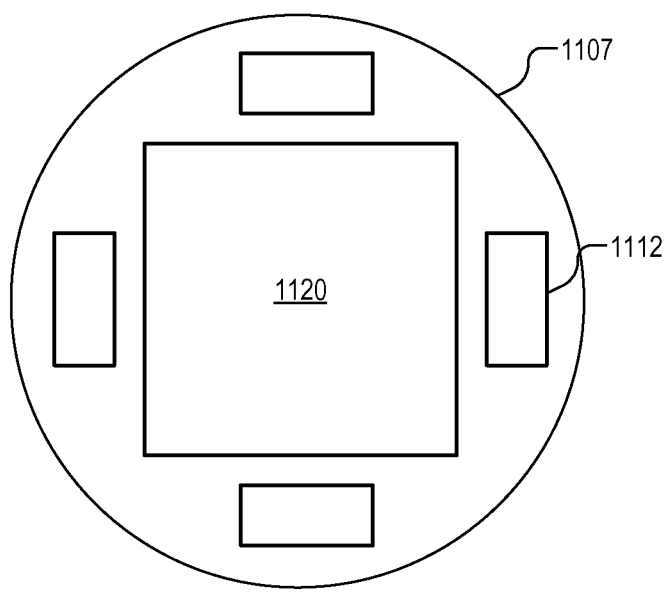
Figure 11D:
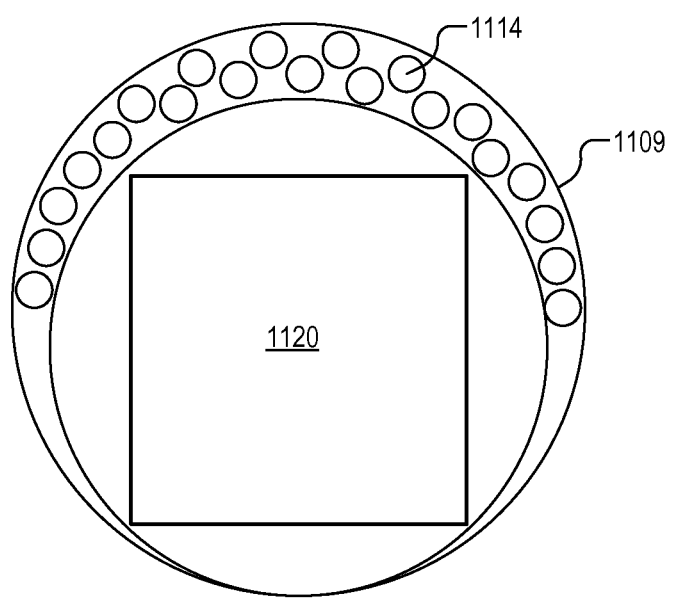

FIG. 11C is a top view of an endoscope tip of endoscope tip 1107 that includes image sensor 1120 and lights 1112. This is a type of endoscope that is used for diagnostic purposes, thus relatively large areas for lighting. In this embodiment, four LED lights 1112 surrounds image sensor 1120. In another embodiment, shown in FIG. 11D, an area around image sensor 1120 of endoscope tip 1109 is occupied by a multitude of optic fibers 1114, which is used to provide lighting at endoscope tip 1109.

The order in which some or all of the processes described herein should not be deemed limiting. Rather, one of ordinary skill in the art having the benefit of the present disclosure will understand that some of the processes may be executed in a variety of orders not illustrated.

The processes explained above are described in terms of computer software and hardware. The techniques described may constitute machine-executable instructions embodied within a machine (e.g., computer) readable medium, that when executed by a machine will cause the machine to perform the operations described. Additionally, the processes may be embodied within hardware, such as a programmable gate array (PGA), an application specific integrated circuit (ASIC) or the like. For example, descriptions for design structures of the aforementioned data I/O logic and clock I/O logic may be generated and compiled for incorporation into other integrated circuits, such as general purpose processors or various application specific integrated circuits ("ASICs"). In particular, behavioral level code describing data I/O logic 355, 455, 755, 855, 955, and 1055 and clock I/O logic 710, 810, 910, and 1010, or portions thereof, may be generated using a hardware descriptive language, such as VHDL (Very High-speed integrated circuit Hardware Descriptive Language) or Verilog, and stored to a machine-accessible medium (e.g., CD-ROM, hard disk, floppy disk, etc.). Furthermore, the behavioral level code can be compiled/synthesized into register transfer level ("RTL") code, a netlist, or even a circuit layout and stored to a machine-accessible medium. The behavioral level code, the RTL code, the netlist, and the circuit layout all represent various levels of abstraction to describe the data and clock I/O circuits discussed herein.

A tangible non-transitory machine-accessible medium includes any mechanism that provides (i.e., stores and/or transmits) information in a form accessible by a machine (e.g., a computer, network device, personal digital assistant, manufacturing tool, any device with a set of one or more processors, etc.). For example, a machine-accessible medium includes recordable/non-recordable media (e.g., read only memory (ROM), random access memory (RAM), magnetic disk storage media, optical storage media, flash memory devices, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. In an image sensor system having an image sensor and a host controller, a method of executing logic included in the image sensor system, the method comprising:
    transferring analog image data from the image sensor to the host controller through a first terminal of the image sensor;
    transferring one or more digital control signals between the image sensor and the host controller through the first terminal, wherein the transferring of one or more digital control signals between the image sensor and the host controller through the first terminal comprises transferring an instruction signal from the host controller to the image sensor through the first terminal;
    transferring a clock signal from the host controller to the image sensor through a second terminal of the image sensor; and
    transferring a command signal from the image sensor to the host controller through the second terminal of the image sensor.

2. The method of claim 1, wherein the analog image data is transferred to the host controller in a series of readout phases, the method further comprising:
    transferring the analog image data from the image sensor to the host controller through the first terminal during an image data output period of the readout phases; and
    transferring the one or more digital control signals between the image sensor and the host controller through the first terminal during a vertical blanking period of the readout phases.

3. The method of claim 1, wherein the analog image data is transferred to the host controller in a series of readout phases, the method further comprising:
    transferring the analog image data from the image sensor to the host controller through the first terminal during an image data output period of the readout phases; and
    transferring the one or more digital control signals between the image sensor and the host controller through the first terminal during a header information period of the readout phases.

4. The method of claim 1, wherein the analog image data is transferred to the host controller in a series of readout phases, the method further comprising:
    transferring the analog image data from the image sensor to the host controller through the first terminal during an image data output period of the readout phases;
    transferring a first digital control signal between the image sensor and the host controller through the first terminal during a vertical blanking period of the readout phases; and
    transferring a second digital control signal between the image sensor and the host through the first terminal during a header information period of the readout phases.

5. The method of claim 1, wherein the transferring of one or more digital control signals between the image sensor and the host controller through the first terminal comprises transferring a command signal from the image sensor to the host controller through the first terminal.

6. The method of claim 5, further comprising:
    transferring a clock signal from the host controller to the image sensor through a second terminal of the image sensor; and transferring an instruction signal from the host controller to the image sensor through the second terminal of the image sensor.

7. The method of claim 1, wherein the digital control signals comprise more than two discrete voltage levels.

8. The method of claim 1, wherein the digital control signals comprise pulses of varying pulse width.

9. The method of claim 1, wherein the digital control signals comprise pulses and wherein a time between the pulses varies.

10. A tangible non-transitory machine-accessible medium containing a design structure for logic of an image sensor system having an image sensor and a host controller that, when executed will perform operations comprising:
transferring analog image data from the image sensor to the host controller through a first terminal of the image sensor;
transferring one or more digital control signals between the image sensor and the host controller through the first terminal, wherein the transferring of one or more digital control signals between the image sensor and the host controller through the first terminal comprises transferring an instruction signal from the host controller to the image sensor through the first terminal;
transferring a clock signal from the host controller to the image sensor through a second terminal of the image sensor; and
transferring a command signal from the image sensor to the host controller through the second terminal of the image sensor.

11. The tangible non-transitory machine-accessible medium of claim 10, wherein the analog image data is transferred to the host controller in a series of readout phases, and wherein execution of the logic performs further operations, comprising:
transferring the analog image data from the image sensor to the host controller through the first terminal during an image data output period of the readout phases; and
transferring the one or more digital control signals between the image sensor and the host controller through the first terminal during one or more periods of the readout phases selected from the group consisting of a vertical blanking period and a header information period.

12. The tangible non-transitory machine-accessible medium of claim 10, wherein execution of the logic performs further operations, comprising:
transferring an instruction signal from the host controller to the image sensor through the first terminal; and
transferring a command signal from the image sensor to the host controller through the first terminal.

13. An image sensor for use in an image sensor system having a host controller, the image sensor comprising logic that when executed performs operations comprising:
transferring analog image data from the image sensor to the host controller through a first terminal of the image sensor;
transferring one or more digital control signals between the image sensor and the host controller through the first terminal, wherein the transferring of one or more digital control signals between the image sensor and the host controller through the first terminal comprises transferring an instruction signal from the host controller to the image sensor through the first terminal;
transferring a clock signal from the host controller to the image sensor through a second terminal of the image sensor; and
transferring a command signal from the image sensor to the host controller through the second terminal of the image sensor.

14. The image sensor of claim 13, wherein the analog image data is transferred to the host controller in a series of readout phases, and wherein execution of the logic performs further operations, comprising:
transferring the analog image data from the image sensor to the host controller through the first terminal during an image data output period of the readout phases; and
transferring the one or more digital control signals between the image sensor and the host controller through the first terminal during one or more periods of the readout phases selected from the group consisting of a vertical blanking period and a header information period.

15. The image sensor of claim 13, wherein execution of the logic performs further operations, comprising transferring a command signal from the image sensor to the host controller through the first terminal.

16. A host controller for use in an image sensor system having an image sensor, the host controller comprising logic that when executed performs operations comprising:
transferring analog image data from the image sensor to the host controller through a first terminal of the image sensor;
transferring one or more digital control signals between the image sensor and the host controller through the first terminal, wherein the transferring of one or more digital control signals between the image sensor and the host controller through the first terminal comprises transferring an instruction signal from the host controller to the image sensor through the first terminal;
transferring a clock signal from the host controller to the image sensor through a second terminal of the image sensor; and
transferring a command signal from the image sensor to the host controller through the second terminal of the image sensor.

17. The host controller of claim 16, wherein the analog image data is transferred to the host controller in a series of readout phases, and wherein execution of the logic performs further operations, comprising:
transferring the analog image data from the image sensor to the host controller through the first terminal during an image data output period of the readout phases; and
transferring the one or more digital control signals between the image sensor and the host controller through the first terminal during one or more periods of the readout phases selected from the group consisting of a vertical blanking period and a header information period.

18. The host controller of claim 16, wherein execution of the logic performs further operations, comprising:
transferring a command signal from the image sensor to the host controller through the first terminal.

19. An image sensor system, comprising:
an image sensor having a first terminal;
a host controller coupled to the first terminal; and
logic that when executed performs operations comprising:
transferring analog image data from the image sensor to the host controller through the first terminal of the image sensor;
transferring one or more digital control signals between the image sensor and the host controller through the first terminal, wherein the transferring of one or more digital control signals between the image sensor and the host controller through the first terminal comprises transferring an instruction signal from the host controller to the image sensor through the first terminal;

transferring a clock signal from the host controller to the image sensor through a second terminal of the image sensor; and transferring a command signal from the image sensor to the host controller through the second terminal of the image sensor.

20. The image sensor system of claim 19, wherein the analog image data is transferred to the host controller in a series of readout phases, and wherein execution of the logic performs further operations, comprising:

transferring the analog image data from the image sensor to the host controller through the first terminal during an image data output period of the readout phases;

transferring the one or more digital control signals between the image sensor and the host controller through the first terminal during one or more periods of the readout phases selected from the group consisting of a vertical blanking period and a header information period.

21. The image sensor system of claim 19, wherein execution of the logic performs further operations, comprising:

transferring a command signal from the image sensor to the host controller through the first terminal.

\* \* \* \* \*